(12) United States Patent
Ng et al.

(10) Patent No.: US 8,484,588 B2
(45) Date of Patent: Jul. 9, 2013

(54) SYSTEM, ARCHITECTURE AND MICRO-ARCHITECTURE (SAMA) REPRESENTATION OF AN INTEGRATED CIRCUIT

(75) Inventors: Pius Ng, Hillsboro, OR (US); Satish Padmanabhan, Sunnyvale, CA (US); Suresh Kadiyala, Cupertino, CA (US)

(73) Assignee: Algo to Chip Corporation, Sunnyvale, CA (US)

( * ) Notice: Subject to any disclaimer, the term of this patent is extended or adjusted under 35 U.S.C. 154(b) by 514 days.

(21) Appl. No.: 12/835,631

(22) Filed: Jul. 13, 2010

(65) Prior Publication Data

US 2012/0017196 A1    Jan. 19, 2012

(51) Int. Cl.
*G06F 17/50*    (2006.01)
(52) U.S. Cl.
USPC .......................................... 716/104; 716/106
(58) Field of Classification Search
USPC .................................................. 716/104–109
See application file for complete search history.

(56) References Cited

U.S. PATENT DOCUMENTS 6,408,428 B1\* 6/2002 Schlansker et al. ........... 716/104
2008/0177996 A1\* 7/2008 Simar et al. ................... 713/100

\* cited by examiner

*Primary Examiner* — Binh Tat
(74) *Attorney, Agent, or Firm* — Tran & Associates

(57) ABSTRACT

Systems and methods are disclosed to automatically generate a custom integrated circuit (IC) design by receiving a specification of the custom IC including computer readable code to be executed by the custom IC; generating an abstraction of the IC as a system, processor architecture and micro-architecture (SAMA) representation; providing the SAMA representation to a data model having at least an architecture optimization view, a physical design view, and a software tool view; optimizing the processor architecture by iteratively updating the SAMA representation and the data model to automatically generate a processor architecture uniquely customized to the computer readable code which satisfies one or more constraints; and synthesizing the generated architecture into a computer readable description of the custom integrated circuit for semiconductor fabrication. The foregoing can be done with no or minimal human involvement.

20 Claims, 4 Drawing Sheets

SYSTEM, ARCHITECTURE AND MICRO-ARCHITECTURE (SAMA) REPRESENTATION OF AN INTEGRATED CIRCUIT

CROSS-REFERENCED APPLICATIONS

This application is related to commonly owned, concurrently filed application Ser. No. 12/835,603 entitled "AUTOMATIC OPTIMAL INTEGRATED CIRCUIT GENERATOR FROM ALGORITHMS AND SPECIFICATION", application Ser. No. 12/835,621 entitled "AUTOMATIC OPTIMAL INTEGRATED CIRCUIT GENERATOR FROM ALGORITHMS AND SPECIFICATION", application Ser. No. 12/835,628 entitled "APPLICATION DRIVEN POWER GATING", application Ser. No. 12/835,631 entitled "SYSTEM, ARCHITECTURE AND MICRO-ARCHITECTURE (SAMA) REPRESENTATION OF AN INTEGRATED CIRCUIT", and application Ser. No. 12/835,640 entitled "ARCHITECTURAL LEVEL POWER-AWARE OPTIMIZATION AND RISK MITIGATION", the contents of which are incorporated by reference.

BACKGROUND

The present invention relates to systems and methods for an intermediate representation of a custom integrated circuit (IC) or an application-specific integrated circuit (ASIC).

As electronics become more user friendly, the features imposed on the electronics have grown. For example, in a typical hardware product development cycle for an embedded application, algorithm development is done. Next, system architects break down how the algorithms need to be implemented in the product. Conventionally, the algorithm is converted into a low level intermediate representation such as a register transfer language (RTL) that is close to the hardware.

RTL is commonly used in the electronics design industry to refer to the coding style used in hardware description languages that effectively guarantees the code model can be synthesized (converted to real logic functions) in a given hardware platform such as an FPGA or an ASIC.

There are many hardware description languages that can be used to create RTL modules for logic synthesis. Some of the most popular RTL modeling languages include: System Verilog, Verilog, and VHDL.

United States Patent Application 20090144690 discloses a method for converting a C-type programming language program to a hardware design, where the program is an algorithmic representation of one or more processes. The C-type programming language program is compiled into a hardware description language (HDL) synthesizable design. The compiler categorizes variables as using either implicit memory or custom memory. The programming language may use ANSI C and the HDL may be Verilog Register Transfer Level (RTL). The hardware device generated from the HDL synthesizable design may be an Application-Specific Integrated Circuit (ASIC) or a Field Programmable Gate Array (FPGA).

However, RTL is still a low level description of the hardware. Thus, it can be difficult to analyze and subsequently to optimize a design with RTL.

SUMMARY

In one aspect, systems and methods automatically generate a custom integrated circuit (IC) design by receiving a specification of the custom IC including computer readable code to be executed by the custom IC; generating an abstraction of the IC as a system, processor architecture and micro-architecture (SAMA) representation; providing the SAMA representation to a data model having at least an architecture optimization view, a physical design view, and a software tool view; optimizing the processor architecture by iteratively updating the SAMA representation and the data model to automatically generate a processor architecture uniquely customized to the computer readable code which satisfies one or more constraints; and synthesizing the generated architecture into a computer readable description of the custom integrated circuit for semiconductor fabrication.

Implementations of the above aspects may include one or more of the following. The system can operate automatically with virtually no or minimal human involvement from algorithm, process, or code input that specifies the function of the custom IC. The user can execute the computer readable code on the custom IC. The data model is an expanded unified functional and physical model of the IC. The data model can receive physical primitive information of the IC. Software tools for the custom IC to run the application code can be automatically generated. The tools include one or more of: Compiler, Assembler, Linker, Cycle-Based Simulator. The tool automatically generates firmware. The tools can profile the firmware and providing the firmware profile as feedback to optimizing the architecture. The system can iteratively optimize the processor architecture based on predetermined physical constraints. The system can perform static profiling or dynamic profiling of the computer readable code. The system can automatically generate a software development kit (SDK) for the custom integrated circuit to run the computer readable code. The computer readable code can be transformed into assembly code and linked to generate firmware for the selected architecture. The system can perform cycle based simulation of the firmware. The architecture can be optimized based on profiled firmware and/or the assembly code. The system can generate register transfer level code for the selected architecture, and thus for a physical design optimized in terms of timing, area, or power. The system can synthesize the RTL code. In one embodiment, SAMA can specify one or more of the following:

1. System
   a. Clocks
   b. Performance Objectives
   c. Pinout
   d. Peripherals
   e. Interrupt Schemes
   f. Connectivity
   g. others
2. Architecture
   a. On-chip memories
   b. Cache
   c. Register Files
   d. Memory Map
   e. HW Functional Blks
   f. Pipeline
   g. ISA Definition
   h. others
3. Tools
   a. Assembler Settings
   b. Linker Variables
   c. others
4. MicroArchitecture
   a. Power Domains
   b. Power Gating
   c. others.

Advantages of the preferred embodiments may include one or more of the following. The SAMA representation provides an intermediate abstraction of the hardware that makes it easy to optimize the processor architecture. The SAMA based system is better than RTL which complicates formal treatment and portability. SAMA allows machine independent, global optimization that precedes code generation. The architecture can use simple and fast code generators usually operate locally. The SAMA system is easier to use, simplify the code generator and to subsequently can optimize the architecture in ways that cannot be done using RTL code.

Other advantages of the preferred embodiments of the system may include one or more of the following. The system alleviates the problems of chip design and makes it a simple process. The embodiments shift the focus of product development process back from the hardware implementation process back to product specification and computer readable code or algorithm design. Instead of being tied down to specific hardware choices, the computer readable code or algorithm can be implemented on a processor that is optimized specifically for that application. The preferred embodiment generates an optimized processor automatically along with all the associated software tools and firmware applications. This process can be done in a matter of days instead of years as is conventional. The described automatic system removes the risk and makes chip design an automatic process so that the algorithm designers themselves can directly make the hardware chip without any chip design knowledge. The primary input to the system would be the computer readable code or algorithm specification in higher-level languages like C or Matlab.

DESCRIPTION

Figure 1:
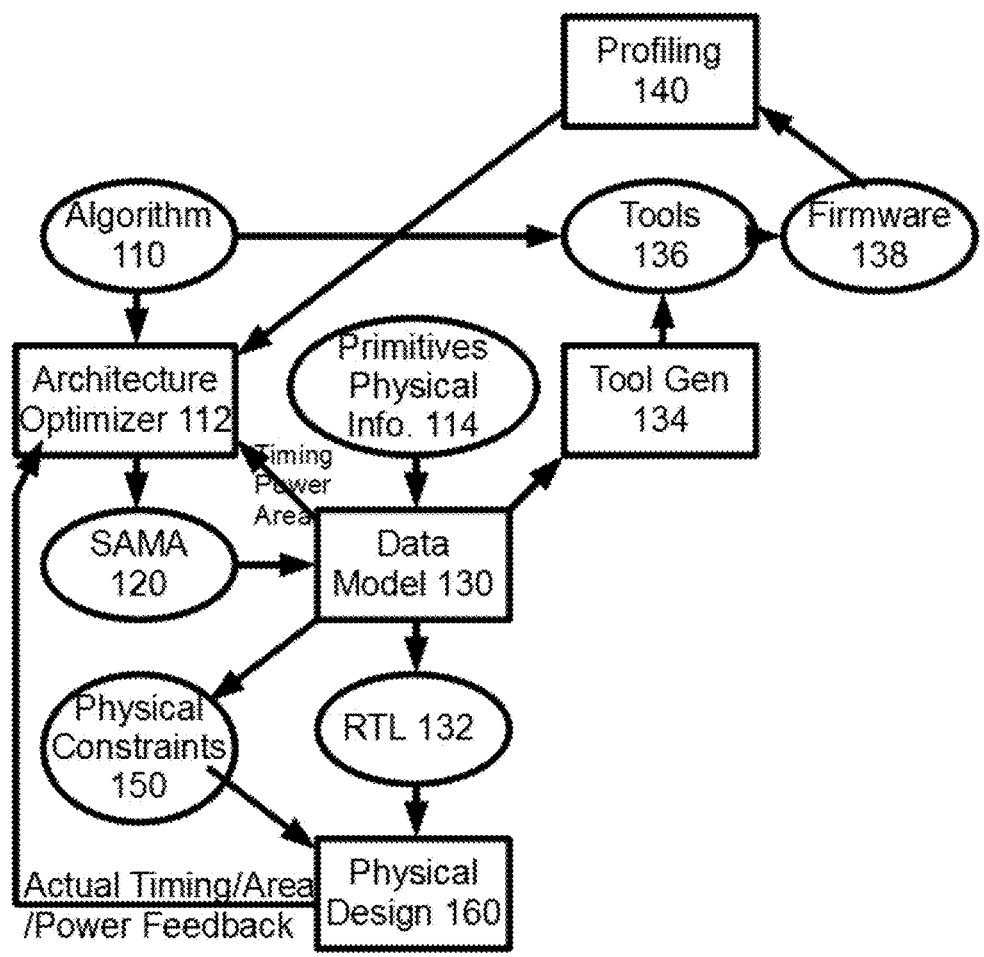
FIG. 1 shows an exemplary work flow system to automatically fabricate an ASIC from application code or algorithm.

FIG. 1 shows an exemplary work flow system to automatically fabricate an ASIC from application code or algorithm. First, the application code or algorithm is generated by a user (110). Next, the code is provided to an architecture optimizer 112. The architecture optimizer 112 generates an intermediate hardware representation customized to the application code called System, Architecture, & Micro-Architecture (SAMA) representation 120 which is an Abstract Unified Representation of the ASIC. The SAMA 120 is a high-level light weight abstract model that allows the Architecture Optimizer 112 to optimize and generate new architecture described in SAMA 120. The SAMA 120 provides information to a Data Model (DM) 130, which is an expanded unified functional and physical model of the ASIC. The DM 130 receives physical primitive information 114 of the ASIC such as adder, multiplier, for example. The DM 130 provides data to a tool generator 134 which in turn drives a set of Tools 136 such as Compiler, Assembler, Linker, Cycle-Based Simulator, among others. The tools 136 generate firmware 138 which can be profiled by profiling tool 140. The profile of the firmware is fed back to the architecture optimizer 112 to optimize the ASIC design based on predetermined physical constraints 150 such as power, area, timing, among others. The DM 130 can generate RTL code 132 that conforms to the constraints 150 to arrive at a physical design 160 with timing, area, power feedback information provided to the architecture optimizer 112.

For example, a general purpose register file is a simple structure. Based on the Profiling of the firmware compiled by the generated tools, the Architecture Optimizer 112 may optimize the size of the register file and generate a new SAMA 120 with reduced register file to save space and power. The resulting new tools may confirm the improvement via another round of profiling.

Figure 2:
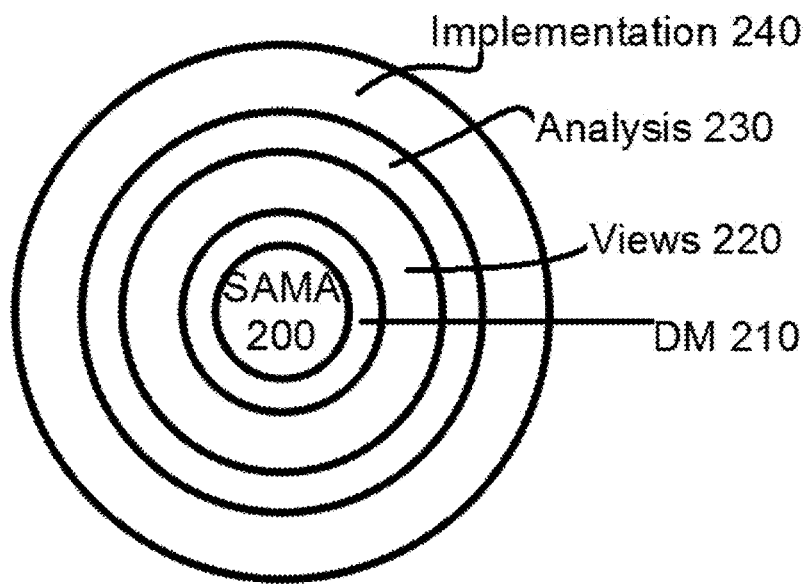
FIG. 2 shows an exemplary view of the relationship between SAMA and the ASIC.

Referring now to FIG. 2, an exemplary view of the relationship between SAMA and the ASIC is shown. The SAMA 200 is the intermediate representation of the hardware that is abstracted from the algorithm such as C code or Mathlab code. A data model (DM) 210 can express the SAMA 200 in various views 220 of the design. An analysis 230 of the views can be done, and if the constraints are met, an implementation 240 can be done.

SAMA acts as a transition layer between software compilation and hardware synthesis. Such a transition layer is intended to take advantage of optimizations available in the compiler tool flow, and also to provide freedom to the low-level synthesizer, to explore options for application-specific implementations.

In one embodiment, SAMA can specify one or more of the following:
1. System
 a. Clocks
 b. Performance Objectives
 c. Pinout
 d. Peripherals
 e. Interrupt Schemes
 f. Connectivity
 g. others
2. Architecture
 a. On-chip memories
 b. Cache
 c. Register Files
 d. Memory Map
 e. HW Functional Blks
 f. Pipeline
 g. ISA Definition
 h. others
3. Tools
 a. Assembler Settings
 b. Linker Variables
 c. others
4. MicroArchitecture
 a. Power Domains
 b. Power Gating
 c. others.

Figure 3:
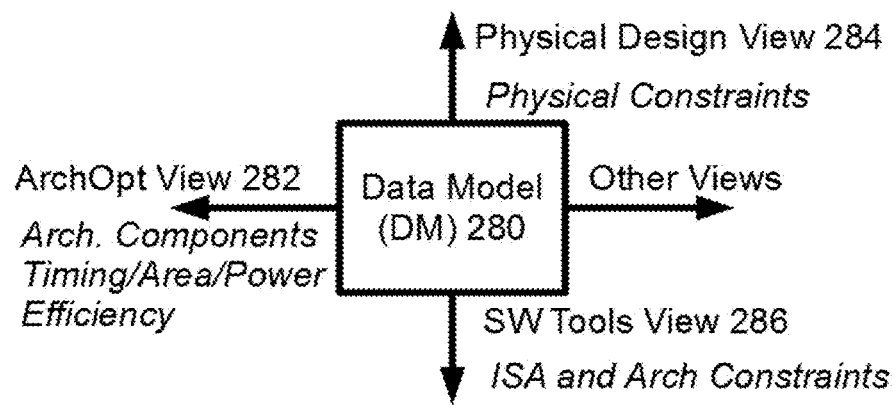
FIG. 3 shows an exemplary data model.

FIG. 3 shows an exemplary data model 280. The DM 280 can be used to generate various views of an application. For example, an architecture optimizer view 282 provides architectural component information such as timing, area, power efficiency so that the optimizer can best fit the design to the constraints. A physical design view 284 can be generated which addresses physical constraints such as space/size requirements. A software tools view 286 can leverage the DM 280 to provide ISA and architectural constraints for the software to use. Other views can be generated from the DM 280 as well.

In one embodiment, the algorithm designers generate computer readable code that solves an application problem. Instead of the manual IC design, the system takes the code and analyzes the code or algorithm. Next, the system automatically generates an optimal architecture based on the code. The architecture is expressed in SAMA and together with the data model, the architecture can be optimized through one or more iterations. Next, an IC fabrication facility can fabricate the custom IC and the resulting IC is optimized to the algorithm with minimal or no human involvement.

Figure 4:
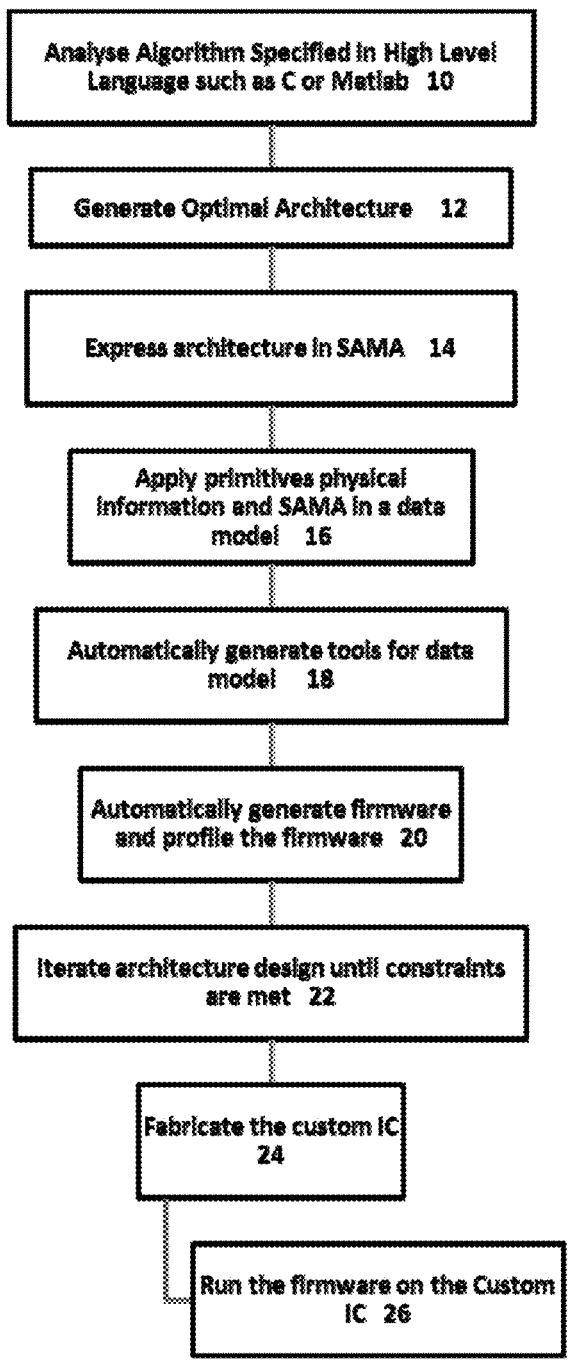
FIG. 4 shows an exemplary workflow process with the SAMA representation.

Referring now to FIG. 4, an exemplary workflow using SAMA is shown. The workflow begins by analyzing Algorithm Specified in High Level Language like C or Matlab (10). Next, the system generates a first design of an Optimal Architecture customized to the algorithm or code (12). The designed architecture is expressed in SAMA (14). The system applies primitive physical information and the SAMA information in a data model (16). Software tools are automatically generated for the data model (18). The system then automatically generates firmware and profile the firmware (20). The system iterates the architecture design until constraints are met (22). The system then fabricates the custom IC (24) and the user can run the firmware on the Custom IC (26).

In one embodiment, the architecture can automatically design a variable width instruction set encoding scheme. The program code which is made up on the variable width instruction set can be further compressed using lossless compression schemes to save storage space. Also when such a compression scheme is chosen, a corresponding de-compression scheme is also automatically designed such that, the instructions are dynamically decoded and issued. The system can optimally encode the instruction set using variable length instruction set. Each instruction can be encoded in any instruction set width that is optimal without restrictions on certain widths. This would allow for more instructions to be supported as compared to traditional encoding schemes and would give significant performance benefits. Also the instructions can be packed with very fine granularity and multiple instructions can be packed in to a single program memory access. This will increase the number of instructions that can be fetched to be issued per cycle. Once the instruction set and architecture is custom designed for the application code/algorithm, a custom integrated circuit is automatically generated by the system with no human involvement, thus reducing product development time and cost. Using an automatically generated software development kit (SDK) and auto generated firmware, the custom IC can run the code/algorithm efficiently.

The embodiments shift the focus of product development process from the hardware implementation process back to product specification and computer readable code or algorithm design. Instead of being tied down to specific hardware choices, the computer readable code or algorithm can be implemented on a processor that is optimized specifically for that application. The preferred embodiment generates an optimized processor automatically along with all the associated software tools and firmware applications. This process can be done in a matter of days instead of years as is conventional.

Figure 5:
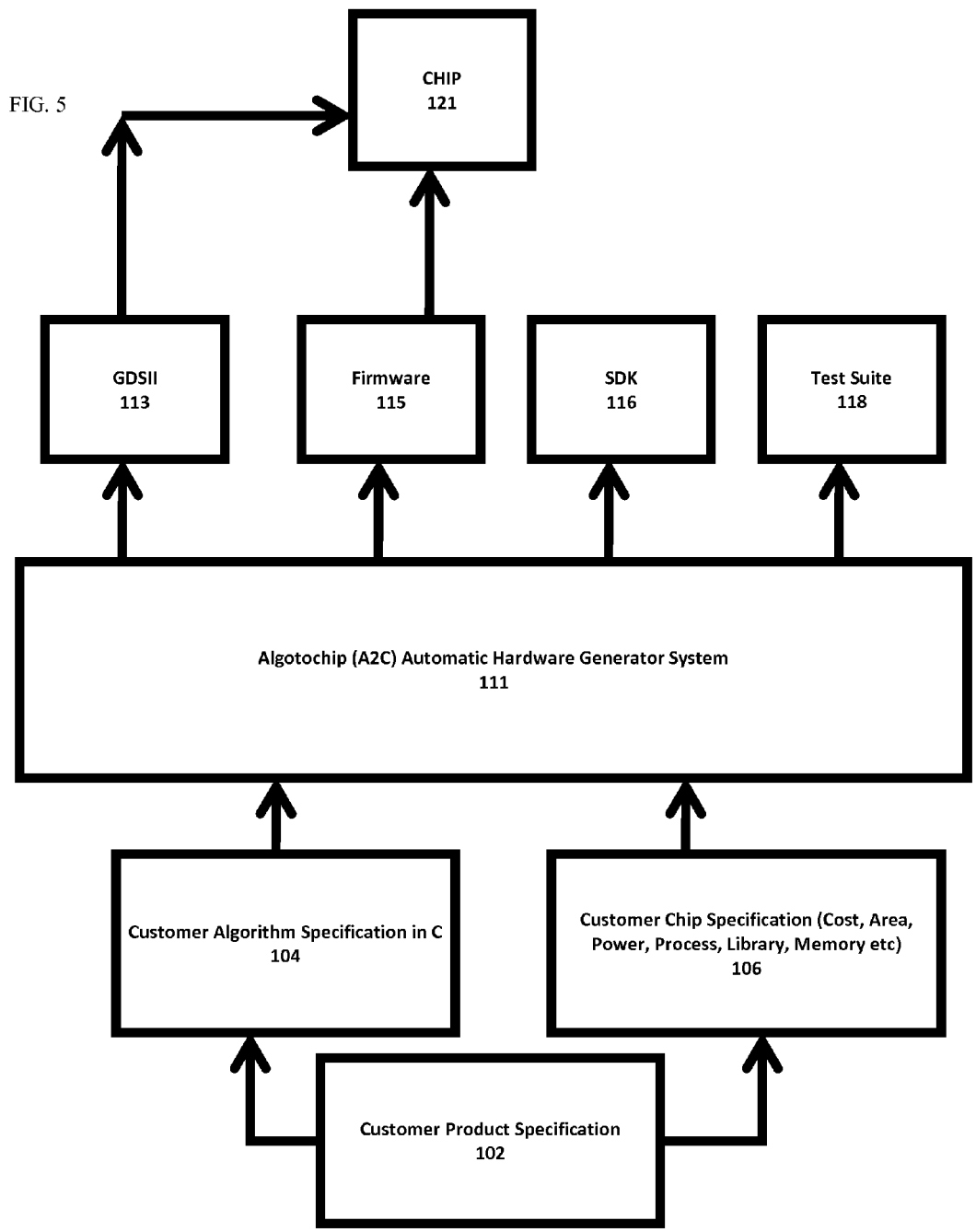
FIG. 5 shows an exemplary system to automatically generate a custom IC using SAMA.

FIG. 5 shows an exemplary system to automatically generate a custom IC. The system of FIG. 5 supports an automatic generation of an architecture with optimal instruction set using instruction set compression and variable width encoding for a programmable hardware solution for the chosen target application. The target application specification is usually done through algorithm expressed as computer readable code in a high-level language like C, Matlab, SystemC, Fortran, Ada, or any other language. The specification includes the description of the target application and also one or more constraints such as the desired cost, area, power, speed, performance and other attributes of the hardware solution.

In FIG. 5, an IC customer generates a product specification 102. Typically there is an initial product specification that captures all the main functionality of a desired product. From the product, algorithm experts identify the computer readable code or algorithms that are needed for the product. Some of these algorithms might be available as IP from third parties or from standard development committees. Some of them have to be developed as part of the product development. In this manner, the product specification 102 is further detailed in a computer readable code or algorithm 104 that can be expressed as a program such as C program or a math model such as a Mathlab model, among others. The product specification 102 also contains requirements 106 such as cost, area, power, process type, library, and memory type, among others.

The computer readable code or algorithm 104 and requirement 106 are provided to an automated IC generator 111. Based only on the code or algorithm 104 and the constraints placed on the chip design, the IC generator 111 automatically generates with few or no human involvement an output that includes a GDS file 113, firmware 115 to run the IC, a software development kit (SDK) 116, and/or a test suite 118. The GDS file 113 and firmware 115 are used to fabricate a custom chip 121.

The instant system alleviates the issues of chip design and makes it a simple process. The system shifts the focus of product development process back from the hardware implementation process back to product specification and algorithm design. Instead of being tied down to specific hardware choices, the algorithm can always be implemented on a processor that is optimized specifically for that application. The system generates this optimized processor automatically along with all the associated software tools and firmware applications. This whole process can be done in a matter of days instead of years that it takes now. In a nutshell the system makes the digital chip design portion of the product development in to a black box.

In one embodiment, the instant system product can take as input the following:
  Computer readable code or algorithm defined in C/Matlab
  Peripherals required
  Area Target
  Power Target
  Margin Target (how much overhead to build in for future firmware updates and increases in complexity)
  Process Choice
  Standard Cell library Choice
  Testability scan The output of the system may be a Digital Hard macro along with all the associated firmware. A software development kit (SDK) optimized for this Digital Hard macro is also automatically generated so that future upgrades to firmware are implemented without having to change the processor.

The system performs automatic generation of the complete and optimal hardware solution for any chosen target application. While the common target applications are in the embedded applications space they are not necessarily restricted to that.

By way of example, a computer to support the automated chip design system is discussed next. The computer preferably includes a processor, random access memory (RAM), a program memory (preferably a writable read-only memory (ROM) such as a flash ROM) and an input/output (I/O) controller coupled by a CPU bus. The computer may optionally include a hard drive controller which is coupled to a hard disk and CPU bus. Hard disk may be used for storing application programs, such as the present invention, and data. Alternatively, application programs may be stored in RAM or ROM.

I/O controller is coupled by means of an I/O bus to an I/O interface. I/O interface receives and transmits data in analog or digital form over communication links such as a serial link, local area network, wireless link, and parallel link. Optionally, a display, a keyboard and a pointing device (mouse) may also be connected to I/O bus. Alternatively, separate connections (separate buses) may be used for I/O interface, display, keyboard and pointing device. Programmable processing system may be preprogrammed or it may be programmed (and reprogrammed) by downloading a program from another source (e.g., a floppy disk, CD-ROM, or another computer).

Each computer program is tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

The invention has been described herein in considerable detail in order to comply with the patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A method to automatically generate a custom integrated circuit (IC) design, comprising:
    a. receiving at a computer a specification of the custom IC including computer readable code to be executed by the custom IC;
    b. generating an abstraction of the IC as a system, processor architecture and micro-architecture (SAMA) representation;
    c. providing the SAMA representation to a data model having at least an architecture optimization view, a physical design view, and a software tool view;
    d. optimizing the processor architecture by iteratively updating the SAMA representation and the data model to automatically generate a processor architecture uniquely customized to the computer readable code which satisfies one or more constraints;
    e. automatically and iteratively generate a customized computer architecture for the computer readable code that best fits the constraints with an application specific instruction set; and
    f. synthesizing the generated architecture into a computer readable description of the custom integrated circuit for semiconductor fabrication.

2. The method of claim 1, comprising executing the computer readable code on the custom IC.

3. The method of claim 1, wherein the data model comprises an expanded unified functional and physical model of the IC.

4. The method of claim 1, wherein the data model receives physical primitive information related to the IC.

5. The method of claim 1, comprising generating software tools.

6. The method of claim 5, wherein the tools include one or more of:
    Compiler, Assembler, Linker, Cycle-Based Simulator.

7. The method of claim 6, wherein the tool automatically generates firmware.

8. The method of claim 7, comprising automatically profiling the firmware and providing the firmware profile as feedback to optimizing the architecture.

9. The method of claim 1, comprising optimizing the processor architecture based on predetermined physical constraints.

10. The method of claim 1, comprising performing static profiling or dynamic profiling of the computer readable code.

11. The method of claim 1, comprising automatically generating firmware or software development kit (SDK) for the custom integrated circuit to run the computer readable code.

12. The method of claim 1, comprising compiling the computer readable code into assembly code.

13. The method of claim 8, comprising linking the assembly code to generate firmware for the selected architecture.

14. The method of claim 8, comprising performing cycle accurate simulation of the firmware.

15. The method of claim 10, comprising performing static or dynamic profiling of the firmware.

16. The method of claim 11, comprising optimizing the architecture based on profiled firmware.

17. The method of claim 8, comprising optimizing the architecture based on the assembly code.

18. The method of claim 1, comprising generating register transfer level code for the selected architecture.

19. The method of claim 18, comprising generating RTL code for a physical design optimized in terms of timing, area, or power.

20. The method of claim 11, comprising performing synthesis of the RTL code.

* * * * *